(12) United States Patent
Moon et al.

(10) Patent No.: US 11,821,956 B2
(45) Date of Patent: Nov. 21, 2023

(54) IN-SITU OPTICAL AND ELECTROCHEMICAL ANALYSIS METHOD AND BATTERY CELL MEASUREMENT MODULE THEREFOR

(71) Applicants: KOREA BASIC SCIENCE INSTITUTE, Daejeon (KR); THE INDUSTRY & ACADEMIC COOPERATION IN CHUNGNAM NATIONAL UNIVERSITY (IAC), Daejeon (KR); KOREA RESEARCH INSTITUTE OF STANDARDS AND SCIENCE, Daejeon (KR)

(72) Inventors: Joonhee Moon, Daejeon (KR); Cheolho Jeon, Sejong (KR); Jouhahn Lee, Daejeon (KR); Kyoung Soon Choi, Daejeon (KR); Chunjoong Kim, Daejeon (KR); Jae Yong Song, Daejeon (KR); Hosun Shin, Daejeon (KR); Sun Hwa Park, Seoul (KR)

(73) Assignees: KOREA BASIC SCIENCE INSTITUTE, Daejeon (KR); THE INDUSTRY & ACADEMIC COOPERATION IN CHUNGNAM NATIONAL UNIVERSITY (IAC), Daejeon (KR); KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 206 days.

(21) Appl. No.: 17/352,799

(22) Filed: Jun. 21, 2021

(65) Prior Publication Data
US 2021/0311125 A1     Oct. 7, 2021

Related U.S. Application Data

(63) Continuation of application No. PCT/KR2018/016375, filed on Dec. 20, 2018.

(51) Int. Cl.
*G01R 31/385* (2019.01)
*G01N 21/47* (2006.01)
(Continued)

(52) U.S. Cl.
CPC .......... *G01R 31/385* (2019.01); *G01N 21/47* (2013.01); *G01N 21/84* (2013.01);
(Continued)

(58) Field of Classification Search
CPC ...... G01R 31/385; G01R 31/28; G01R 31/36; G01N 21/47; G01N 21/84; G01N 29/11;
(Continued)

(56) References Cited

U.S. PATENT DOCUMENTS

2016/0322677 A1* 11/2016 Jung ................. H01M 10/0525

FOREIGN PATENT DOCUMENTS

CN     104393223 B     12/2016
JP     2010019813     1/2010
(Continued)

OTHER PUBLICATIONS

"Notice of Reason for Refusal issued to corresponding Japanese Application No. 2021-536346", dated Oct. 18, 2022, 10 Pages.
(Continued)

*Primary Examiner* — Lee E Rodak
*Assistant Examiner* — Trung Q Nguyen
(74) *Attorney, Agent, or Firm* — GUNTIN & GUST, PLC; Miyoung Shin

(57) ABSTRACT

A battery cell measurement module includes a lower housing having a connection part and a fixing part connected to the lower housing. An upper portion of the fixing part has a battery cell accommodation space accommodating a battery cell. The fixing part includes a connection hole that is in communication with the battery cell accommodation space and has the connection part arranged therein. Module
(Continued)

includes a height control part that extends from the battery cell accommodation space to the connection part via the connection hole. Module includes an upper housing detachably attached to the lower housing, arranged to surround the fixing part and the height control part, and provided with a transparent window. The battery cell has an opening in an upper surface of the battery cell and is accommodated in the battery cell accommodation space such that the opening is located at a position vertically overlapping the transparent window.

7 Claims, 11 Drawing Sheets

(51) Int. Cl.
H01M 10/42 (2006.01)
G01N 21/84 (2006.01)
H01M 10/44 (2006.01)
H01M 10/48 (2006.01)

(52) U.S. Cl.
CPC ....... *H01M 10/4285* (2013.01); *H01M 10/44* (2013.01); *H01M 10/48* (2013.01)

(58) Field of Classification Search
CPC ........ G01N 2291/048; H01M 10/4285; H01M 10/44; H01M 10/48
USPC ........... 324/400, 430–437, 500, 600, 764.01, 324/103 R, 771, 761.01, 501, 639, 642, 324/702, 76.11, 76.66, 96
See application file for complete search history.

(56) References Cited

FOREIGN PATENT DOCUMENTS

| KR | 101274730 | 6/2013 |
| KR | 1020150047796 | 5/2015 |
| KR | 1020150099896 | 9/2015 |
| KR | 20160129612 A | 11/2016 |
| KR | 101705703 | 2/2017 |

OTHER PUBLICATIONS

International Search Report for International Application PCT/KR2018/016375, dated Sep. 9, 2019.

* cited by examiner

IN-SITU OPTICAL AND ELECTROCHEMICAL ANALYSIS METHOD AND BATTERY CELL MEASUREMENT MODULE THEREFOR

CROSS-REFERENCE TO RELATED APPLICATIONS

The present application is a continuation application of International Application No. PCT/KR2018/016375, filed Dec. 20, 2018, which claims the benefit of and priority to Korean Application No. 10-2018-0165533, filed Dec. 19, 2018. The above-referenced applications are hereby incorporated herein by reference in their entirety.

TECHNICAL FIELD

The present disclosure relates to an in-situ optical and electrochemical analysis method and a battery cell measurement module therefor, and more particularly, to a battery cell measurement module capable of electrochemical behavior analysis via observation of the inside of a battery cell during charging and discharging and an in-situ optical and electrochemical analysis method using same.

BACKGROUND

Recently, as the demand for using lithium-ion batteries in various application fields such as small mobile devices and electric vehicles increases, there is a growing need to optimize the performance of lithium-ion batteries according to various requirements for various application fields. In particular, studies on electrochemical properties of new cathode active material candidates and anode active material candidates having large capacity and low cost have been actively conducted. However, the relationship between phase change characteristics and electrochemical performance of some of new cathode active materials and anode active materials according to charging and discharging has not been clearly identified. Therefore, it is difficult to improve the performance of these candidate materials and commercialize these candidate materials.

SUMMARY

According to an aspect of the present disclosure, a battery cell measurement module for in-situ optical and electrochemical analysis may include: a lower housing having a connection part formed on an upper portion of the lower housing; a fixing part connected to the lower housing, an upper portion of the fixing part having a battery cell accommodation space in which a battery cell is accommodated, and the fixing part including a connection hole in communication with the battery cell accommodation space, and the connection hole having the connection part arranged therein; a height control part which extends from the battery cell accommodation space of the fixing part to the connection part via the connection hole; an upper housing which is detachably attached to the lower housing, the upper housing arranged to surround the fixing part and the height control part, and the upper housing provided with a transparent window; and the battery cell which has an opening in an upper surface of the battery cell, the battery cell is accommodated in the battery cell accommodation space such that the opening is located at a position vertically overlapping the transparent window.

In example embodiments, the height control part may include: an upper plate body having the battery cell arranged on an upper portion of the upper plate body; and a fixing pillar portion formed at a lower portion of the upper plate body and formed to be connected to the connection part, wherein a height of the height control part is adjusted via the fixing pillar portion.

In example embodiments, the battery cell may include: a lower case including a battery stack accommodation space; a cathode current collector which is arranged in the battery stack accommodation space and has a cathode active material attached thereto; an anode current collector which is arranged in the battery stack accommodation space and has an anode active material attached thereto; a separator arranged between the cathode active material and the anode active material; and an upper case which covers the battery stack accommodation space and has the opening.

In example embodiments, the battery cell measurement module may further include: a lower connection part connected to the lower housing; an upper connection part connected to the upper housing, wherein the lower case of the battery cell is electrically connected to the lower connection part via the height control part, the connection part, and the lower housing, and the upper case of the battery cell is electrically connected to the upper connection part via the upper housing.

In example embodiments, the cathode current collector may include a through-hole at a position overlapping the opening, and the cathode current collector may be arranged such that an upper surface of the cathode active material is exposed via the through-hole and the opening to be observed via the transparent window.

In example embodiments, the cathode current collector, the cathode active material, and the separator may include a through-hole at a position overlapping the opening, and the cathode current collector, the cathode active material, and the separator may be arranged such that an upper surface of the anode active material is exposed via the through-hole and the opening to be observed via the transparent window.

In example embodiments, the battery cell measurement module may further include a spacer arranged between the height control part and the battery cell.

According to another aspect of the present disclosure, an in-situ optical and electrochemical analysis method using a battery cell measurement module may include: performing charging and discharging operations on the battery cell measurement module; and performing, a plurality of times, a light measurement cycle on the battery cell measurement module, wherein the light measurement cycle includes: irradiating first light to a first portion of the battery cell observed via the transparent window; detecting the first light scattered from the battery cell; irradiating, to the first portion of the battery cell observed via the transparent window, second light having a second wavelength that is different than a first wavelength of the first light; and detecting the second light scattered from the battery cell, the battery cell measurement module including: a lower housing having a connection part formed on an upper portion of the lower housing; a fixing part connected to the lower housing, an upper portion of the fixing part having a battery cell accommodation space in which a battery cell is accommodated, the fixing part including a connection hole in communication with the battery cell accommodation space, the connection hole having the connection part arranged therein; a height control part which extends from the battery cell accommodation space of the fixing part to the connection part via the connection hole; an upper housing which is detachably attached to the lower housing, the upper housing arranged to surround the fixing part and the height control part, and the upper housing provided with a transparent window; and the battery cell which has an opening in the upper surface of the battery cell, the battery cell is accommodated in the battery cell accommodation space such that the opening is located at a position vertically overlapping the transparent window.

In example embodiments, the irradiating of the second light may include continuously irradiating the second light by a first scan width along the upper surface of the battery cell observed via the transparent window.

DETAILED DESCRIPTION OF EMBODIMENTS

Figure 1:
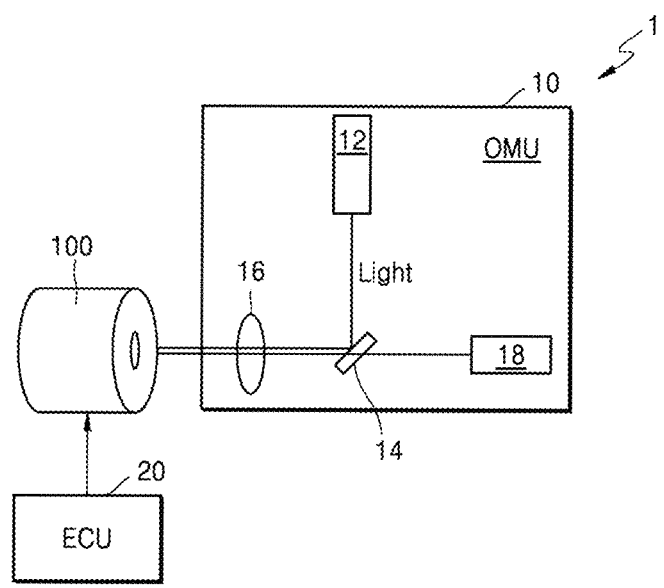
FIG. 1 is a schematic view illustrating an in-situ optical measurement system according to example embodiments.

Provided is a battery cell measurement module capable of precise analysis of an electrochemical behavior via observation of the inside of a battery cell during charging and discharging.

Provided is an in-situ optical and electrochemical analysis method capable of precise analysis of an electrochemical behavior via observation of the inside of a battery cell during charging and discharging by using a battery cell measurement module A battery cell measurement module according to the present disclosure may be easily formed, for example, by first forming a coin-type battery cell in an adjusted environment such as a glove box, arranging the battery cell in a battery cell accommodation space of the battery cell measurement module, and adjusting the height via a height control part such that the battery cell is tightly fixed to both a lower housing and an upper housing.

Therefore, damage to an active material or an electrolyte in an assembly process of the battery cell may be prevented. Also, the battery cell may be easily formed to have a relatively low resistance without risk of an electrical short circuit or the like. As the resistance of the battery cell measurement module decreases, wanted electrochemical tests (e.g., charging and discharging at high current rates) may be appropriately performed under various current conditions, or the deviation between an electrochemical behavior in a commercial battery cell and an electrochemical behavior in the battery cell measurement module may be reduced (i.e., the electrochemical behavior in the commercial battery cell may be precisely simulated).

In order to fully understand the structure and effect of the present disclosure, example embodiments of the present disclosure will be described with reference to the accompanying drawings. The present disclosure may, however, be embodied in many different forms and should not be construed as being limited to the embodiments set forth herein. These embodiments are provided so that the present disclosure will be thorough and complete, and will fully convey the concept of the disclosure to those skilled in the art. In the drawings, the thicknesses or sizes of elements are enlarged more than actual thicknesses or sizes for convenience of description, and the proportion of each element may be exaggerated or reduced.

It will be understood that when an element is referred to as being "on," "connected to" or "coupled to" another element, it may be directly on, connected or coupled to other element or intervening elements may be present. In contrast, when an element is referred to being "directly on," "directly connected to" or "directly coupled to" another element, there are no intervening elements present. Other words used to describe the relationship between elements should be interpreted in a like fashion (e.g., "between," versus "directly between," "adjacent," versus "directly adjacent," etc.).

While such terms as "first," "second," etc., may be used to describe various elements, such elements must not be limited to the above terms. The above terms are used only to distinguish one element from another. For example, a first element may be termed a second element, and, similarly, a second element may be termed a first element, without departing from the scope of the preset disclosure.

An expression used in the singular encompasses the expression of the plural, unless it has a clearly different meaning in the context. It will be understood that the terms "comprises," "comprising," "includes," "including," "have," "having," etc. when used herein, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms used herein have the same meanings as commonly understood by one of ordinary skill in the art to which example embodiments belong.

Hereinafter, the present disclosure will be described in detail by describing example embodiments of the present disclosure with reference to the accompanying drawings.

Figure 2:
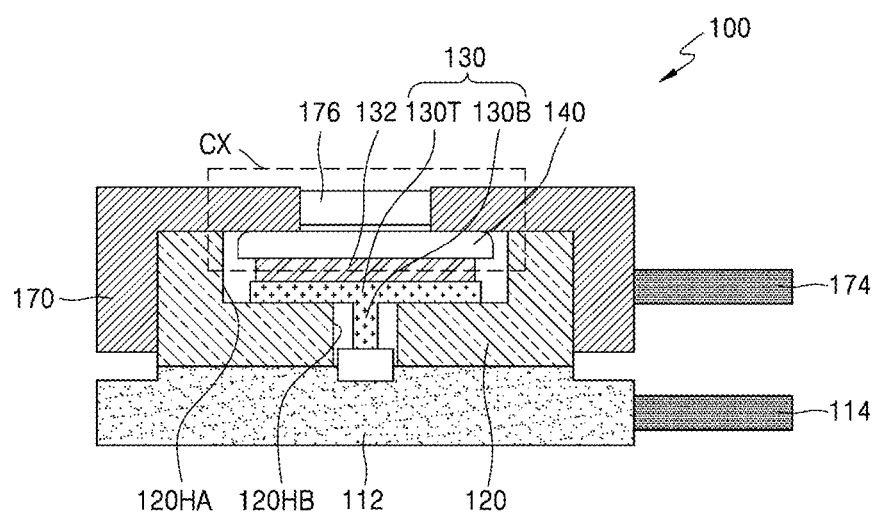
FIG. 2 is a cross-sectional view illustrating a battery cell measurement module according to example embodiments.
Figure 3:
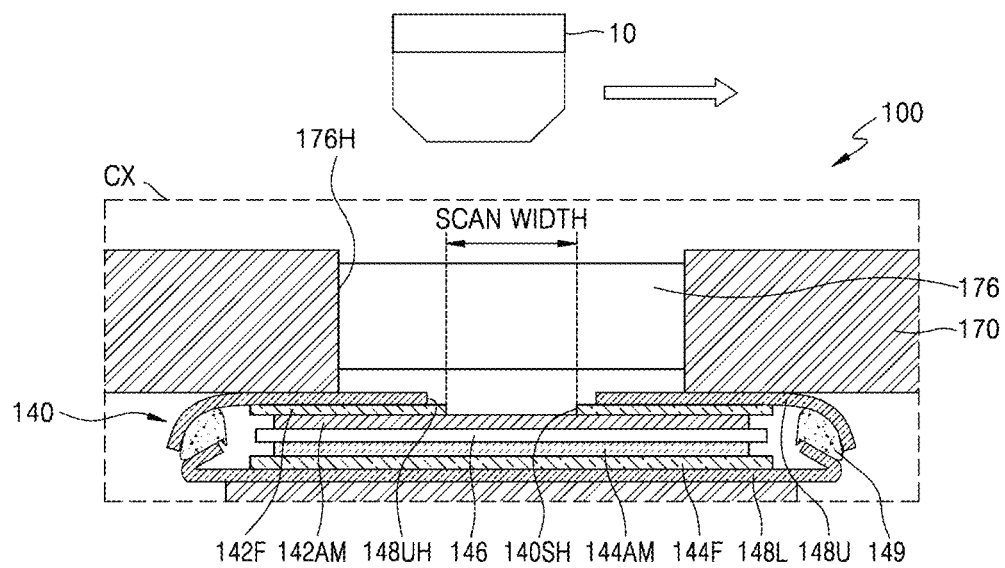
FIG. 3 is an enlarged view of a portion CX of FIG. 2.

FIG. 1 is a schematic view illustrating an in-situ optical measurement system 1 according to example embodiments. FIG. 2 is a cross-sectional view illustrating a battery cell measurement module 100 according to example embodiments. FIG. 3 is an enlarged view of a portion CX of FIG. 2.

Referring to FIGS. 1 through 3, the in-situ optical measurement system 1 may include an optical analysis unit (OMU) 10, an electrochemical analysis unit (ECU) 20, and the battery cell measurement module 100.

The optical analysis unit 10 may be configured as a measurement device capable of analyzing optical characteristics of a battery cell 140 included in the battery cell measurement module 100. In example embodiments, the optical analysis unit 10 may be configured to perform optical image analysis and Raman shift analysis. In other embodiments, the optical analysis unit 10 may include a plurality of analysis units capable of optical image analysis, Raman shift analysis, and photoluminescence (PL) characteristic analysis, respectively.

For example, the optical analysis unit 10 may include a Raman spectrometer capable of irradiating light to the battery cell 140 by using a laser as a light source, and receiving and detecting light reflected through the battery cell 140. Also, the optical analysis unit 10 may further include an optical microscope. The optical microscope may store image information of the battery cell 140 via a CCD camera (not shown) by irradiating light to the battery cell 140 and receiving light reflected through the battery cell 140.

For example, the optical analysis unit 10 may include a light source 12, a light splitter 14, a lens 16, and a detector 18. For example, the light source 12 may include a laser source, and a laser may be emitted from the light source 12. The light splitter 14 may reflect light emitted from the light source 12 to be incident on the lens 16. The light incident on the lens 16 may be incident on the battery cell 140 in the battery cell measurement module 100. Light scattered from the battery cell 140 may pass through the lens 16 and the light splitter 14 to be received by the detector 18. The detector 18 may include a camera or a spectrometer.

In example embodiments, an optical microscope may irradiate light to a measurement region of the battery cell measurement module 100 (i.e., a region indicated by a scan width in FIG. 3) to store an image of the measurement region. Also, a Raman spectrometer may irradiate light to a plurality of fixed measurement positions within the measurement region to acquire the results of Raman shift measurement from the plurality of fixed measurement positions. In addition, the Raman spectrometer may irradiate light to measurement positions continuously arranged along a measurement line having a first scan width within the measurement region to acquire the result of Raman shift measurement from the measurement line.

The electrochemical analysis unit 20 may be configured as a measurement device capable of analyzing the electrochemical performance of the battery cell 140 included in the battery cell measurement module 100. For example, the electrochemical analysis unit 20 may be configured to be electrically connected to the battery cell 140 to adjust a voltage and current of the battery cell 140 or record voltage information and current information of the battery cell 140.

For example, the electrochemical analysis unit 20 may be configured to drive, a plurality of times, an electrochemical cycle including charging and discharging for the battery cell 140. In a charging cycle for the battery cell 140, a current may be applied to the battery cell 140 at a preset current rate, and a voltage of the battery cell 140 according to the application of the current may be measured and recorded. When the voltage of the battery cell 140 reaches a preset off voltage, a discharging cycle for the battery cell 140 may be initiated, and a voltage of the battery cell 140 through which a discharging current flows at a preset current rate may be measured and recorded.

The battery cell measurement module 100 may be configured to include a transparent window 176, irradiate light to the battery cell 140 via the transparent window 176, and detect light reflected from the battery cell 140. The battery cell 140 may be first formed to include therein a cathode current collector 142F, a cathode active material 142AM, a separator 146, an anode active material 144AM, and an anode current collector 144F, like a coin-type commercial battery, and then, the battery cell 140 may be assembled in the battery cell measurement module 100. The battery cell 140 may include an opening 148 UH located at a position overlapping the transparent window 176. The battery cell measurement module 100 may be configured so that, within a measurement region observable via the transparent window 176 (i.e., a region indicated by the scan width), the upper surface of the cathode active material 142AM exposed via the opening 148UH located at the position overlapping the transparent window 176 may be observed. Optical image analysis and Raman analysis may be easily performed on a plurality of fixed positions or a continuous measurement line within the measurement region by continuously scanning a region of a portion of the upper surface of the cathode active material 142AM exposed via the opening 148UH.

According to example embodiments, while electrochemical characteristic analysis is performed on the battery cell 140 via the electrochemical analysis unit 20, image analysis and Raman analysis may be simultaneously performed on a portion of the battery cell 140 via the optical analysis unit 10. Accordingly, comprehensive analysis, such as identification of an electrochemical reaction of the active material occurring during charging and discharging for the cathode active material 142AM that is an object of interest, observation of a change in a crystalline phase or crystalline structure, or analysis of a reaction rate in a local region, may be performed with respect to an electrochemical behavior of the battery cell 140.

In an existing in-situ electrochemical cell, a measurement module fixed to optical equipment, in which a cathode electrode, a separator, and an anode electrode are sequentially stacked, and the stack thereof is simultaneously fixed in a screw method is used, or a dedicated measurement kit using a mesh-type dedicated electrode and a dedicated separator is used.

In a case of a screw-type measurement module, the stack may not be easily formed in an adjusted environment (e.g., in a nitrogen atmosphere) such as a glove box, and thus, an active material and an electrolyte may be oxidized or damaged. Also, in a stage of fixing the stack in a screw method, an electrical short circuit may easily occur. Although the stack is fixed in the screw method, complete electrical connection to the optical equipment may not be easily provided, and thus, the resistance of a stack measurement module may be relatively high. Therefore, performing an electrochemical test at a high current density is not appropriate, and test conditions and types of testable active materials are limited.

Also, a dedicated measurement kit may use a mesh-type electrode, and thus, some of new cathode active materials and anode active materials, e.g., a stand-alone type carboorganic cathode active material or the like that may not need a mesh-type electrode, may not be easily applied to the dedicated measurement kit. In addition, the height of the dedicated measurement kit is not easily adjusted, and the resistance of the dedicated measurement kit is relatively high. Therefore, performing an electrochemical test at a high current density is not appropriate. Accordingly, test conditions and types of testable active materials are limited.

However, according to the present disclosure, the coin-type battery cell 140 may be first formed, and then, the battery cell 140 may be assembled within the battery cell measurement module 100, and the cathode active material 142AM may be observed or measured via the transparent window 176 and the opening 148UH. Therefore, the battery cell 140 may be assembled in an adjusted environment such as a glove box, and thus, an active material or an electrolyte may be prevented from being damaged. Also, the battery cell 140 may have a relatively low resistance, and thus, electrochemical tests may be performed under various conditions, including an electrochemical test at a high current density. Therefore, electrochemical behaviors of the battery cell 140 occurring in charging and discharging stages for the battery cell 140 may be precisely measured or analyzed.

Hereinafter, the detailed structure of the battery cell measurement module 100 will be described in detail with reference to FIGS. 2 and 3.

The battery cell measurement module 100 may include a lower housing 110 and an upper housing 170 detachably attached to the lower housing 110.

The lower housing 110 may include a metal material having rigidity. For example, the lower housing 110 may be formed of an SUS material to prevent corrosion but is not limited thereto.

A connection part 112 may be arranged in the center of the upper surface of the lower housing 110. The connection part 112 may be arranged to protrude upwards from the upper surface of the lower housing 110. In example embodiments, the connection part 112 may be integrally formed with the lower housing 110 but is not limited thereto. In other embodiments, the lower housing 110 and the connection part 112 may be screwed together. In this case, the connection part 112 may further include a screw thread (not shown) on the outer circumferential surface thereof, and a screw thread (not shown) may be further formed on an inner sidewall in contact with the connection part 112 of the lower housing 110, so that the lower housing 110 and the connection part 112 may be screwed together.

A fixing part 120 including a battery cell accommodation space 120HA and a connection hole 120HB may be arranged on the lower housing 110. The fixing part 120 may be connected to the lower housing 110 such that the connection part 112 is arranged inside the connection hole 120HB. The battery cell accommodation space 120HA may be arranged above the connection hole 120HB to communicate with the connection hole 120HB. The battery cell accommodation space 120HA may have a horizontal width that is greater than that of the connection hole 120HB. The horizontal width of the battery cell accommodation space 120HA may be greater than a horizontal width of the battery cell 140. The fixing part 120 may be formed by using an insulating material having rigidity, e.g., a plastic material such as a ceramic material or epoxy, for electrical insulation between the lower housing 110 and the upper housing 170.

A height control part 130 may be arranged on the fixing part 120. The height control part 130 may include an upper plate body 130T and a fixing pillar portion 130B. The battery cell 140 may be arranged on the upper plate body 130T, and the fixing pillar portion 130B may extend from the lower portion of the upper plate body 130T in a vertical direction (i.e., in a direction perpendicular to the upper surface of the lower housing 110). The fixing pillar portion 130B may be arranged inside the connection hole 120HB of the fixing part 120, and may be connected to the connection part 112 inside the connection hole 120HB. The fixing pillar portion 130B may be screwed with the connection part 112. In this case, screw threads (not shown) may be respectively arranged on the inner circumferential surface of the connection part 112 and the outer circumferential surface of the fixing pillar portion 130B. For example, a height of the fixing pillar portion 130B may be adjusted according to the degree of connection thereof to the connection part 112 but is not limited thereto. The height control part 130 may be formed of an SUS material to prevent corrosion and have electrical conductivity but is not limited thereto.

In some embodiments, a spacer 132 may be arranged on the upper plate body 130T of the height control part 130. When the battery cell 140 arranged on the height control part 130 has a relatively small thickness, the spacer 132 may be selectively arranged on the upper plate body 130T to tightly fix the battery cell 140 between the lower housing 110 and the upper housing 170. The spacer 132 may be formed of a SUS material to prevent corrosion and have electrical conductivity but is not limited thereto.

The battery cell 140 may be arranged on the height control part 130 (selectively, on the spacer 132). The battery cell 140 may be a coin-type battery cell. For example, the battery cell 140 may have the same size as a 2016-type commercial coin cell having a width of 20 mm and a thickness of 16 mm or a 2032-type commercial coin cell having a width of 20 mm and a thickness of 32 mm. For example, when the battery cell 140 has the same size as the 2016-type commercial coin cell, the spacer 132 may be arranged between the height control part 130 and the battery cell 140.

The battery cell 140 may include a battery stack of the cathode current collector 142F, the cathode active material 142AM, the separator 146, the anode active material 144AM, and the anode current collector 144F. The battery stack may be arranged within a battery stack accommodation space (not shown) of a lower case 148L, and an upper case 148U may cover the lower case 148L.

The upper case 148U may include the opening 148UH in a central region thereof, and the opening 148UH may be located at a position overlapping the transparent window 176 of the upper housing 170.

A sealing material 149 may be arranged between the upper case 148U and the lower case 148L to prevent an electrical short circuit between the upper case 148U and the lower case 148L. The cathode current collector 142F may be in contact with the upper case 148U, and the anode current collector 144F may be in contact with the lower case 148L. Although not shown, the cathode active material 142AM, the separator 146, and the anode active material 144AM may be soaked in an electrolyte.

The cathode current collector 142F may include a conductive material and may be a thin conductive foil or a thin conductive mesh. For example, the cathode current collector 142F may include aluminum, nickel, copper, gold, or an alloy thereof.

The cathode active material 142AM may include a material capable of reversibly intercalating/deintercalating lithium ions. The cathode active material 142AM may be an active material for analyzing phase change characteristics according to charging and discharging via the optical analysis unit 10 and the electrochemical analysis unit 20. In example embodiments, the cathode active material 43M may include a carboorganic-based cathode active material, a lithium phosphate-based cathode active material having an olivine structure, a vanadium oxide-based cathode active material, layered lithium metal oxides, a lithium manganese oxide-based cathode active material having a spinel structure, a sulfur-based cathode active material, or the like. For example, the result of analyzing, via the in-situ optical measurement system 1, electrochemical performance and phase change characteristics of the battery cell 140 using dimethyl phenazine and lithium metal oxide as the cathode active material 142AM will be described in detail with reference to FIGS. 6 through 11.

Although not shown, the cathode active material 142AM may further include a binder or a conductive material inside. The binder may attach particles of the cathode active material 142AM to each other and attach the cathode active material 142AM to the cathode current collector 142F. The conductive material may provide electrical conductivity to the cathode active material 142AM.

The anode current collector 144F may include a conductive material and may be a thin conductive foil or a thin conductive mesh. For example, the anode current collector 144F may include copper, nickel, aluminum, gold, or an alloy thereof. The anode active material 144AM may include a material capable of reversibly intercalating/deintercalating lithium ions. The anode active material 144AM may be an active material needed to analyze phase change characteristics according to charging and discharging via the optical analysis unit 10 and the electrochemical analysis unit 20. In example embodiments, the anode active material 144AM may include a carbon-based anode active material, a graphite-based anode active material, a silicon-based anode active material, a tin-based anode active material, a composite anode active material, a lithium metal anode active material, or the like.

Although not shown, the anode active material 144AM may further include a binder or a conductive material inside. The binder may attach particles of the anode active material 144AM to each other and attach the anode active material 144AM to the anode current collector 144F. The conductive material may provide electrical conductivity to the anode active material 144AM.

The separator 146 may have porosity and may be configured as a single layer or a multilayer of two or more layers. The separator 146 may include a polymer material, e.g., at least one of polyethylene-based polymers, polypropylene-based polymers, polyvinylidene fluoride-based polymers, polyolefin-based polymers, and the like.

The battery stack may have a through-hole 140SH in a central region thereof. For example, the through-hole 140SH pass through the cathode current collector 142F, and the upper surface of the cathode active material 142AM may be exposed at the bottom of the through-hole 140SH. The through-hole 140SH may be formed at a position overlapping the opening 148UH of the upper case 148U. A composition or image of a material may be continuously observed at one or more fixed positions on the upper surface of the cathode active material 142AM exposed at the bottom of the through-hole 140SH via the transparent window 176 and the opening 148UH.

The upper housing 170 may include a metal or insulating material having rigidity. For example, the upper housing 170 may be formed of an SUS material to prevent corrosion but is not limited thereto. The upper housing 170 may be connected to the lower housing 110 in a shape surrounding the outer surface of the fixing part 120. For example, the upper housing 170 may be screwed with the lower housing 110 but is not limited thereto.

The upper housing 170 may have an opening 176H in a central region thereof, and the transparent window 176 may be arranged within the opening 176H. The transparent window 176 may be formed of a transparent insulating material. For example, the transparent window 176 may include quartz or beryllium glass. Although not shown, a sealing member such as an o-ring may be further formed at an edge portion of the transparent window 176.

The bottom surface of the upper housing 170 adjacent to the transparent window 176 may be tightly fixed to the upper surface of the battery 140 (i.e., the upper case 148U).

A lower connection part 114 may be connected to the outer sidewall of the lower housing 110, and an upper connection part 174 may be connected to the outer sidewall of the upper housing 170. The lower connection part 114 may be arranged to be electrically connected to the lower case 148L of the battery cell 140 via the lower housing 110, the connection part 112, the height control part 130, and selectively the spacer 132. The upper connection part 174 may be arranged to be electrically connected to the upper case 148U of the battery cell 140 via the upper housing 170. The lower connection part 114 may be a connection terminal capable of supplying a current from the electrochemical analysis unit 20 to the anode active material 144AM of the battery cell 140. The upper connection part 174 may be a connection terminal capable of supplying a current from the electrochemical analysis unit 20 to the cathode active material 142AM of the battery cell 140.

In an existing in-situ electrochemical cell, a measurement module fixed to optical equipment, in which a cathode electrode, a separator, and an anode electrode are sequentially stacked, and the stack thereof is simultaneously fixed in a screw method, or a dedicated measurement kit using a mesh-type dedicated electrode and a dedicated separator is used.

In a case of a screw-type measurement module, the stack may not be easily formed in an adjusted environment such as a globe box, and thus, an active material and an electrolyte may be oxidized or managed. Also, in a stage of fixing the stack in a screw method, an electrical short circuit may occur. In addition, although the stack is fixed in the screw method, complete electrical connection to the optical equipment is not easily provided, and thus, the resistance of a stack measurement module may be relatively high. Therefore, performing an electrochemical test at a high current density may not be appropriate, and test conditions and types of testable active materials may be limited.

Also, a dedicated measurement kit needs to use a mesh-type electrode, and thus, some of new cathode active materials and anode active materials, e.g., a stand-alone type carboorganic cathode active material or the like that does not need a mesh-type electrode is not easily applied to the dedicated measurement kit. In addition, a height of the dedicated measurement kit is not easily adjusted, and the resistance of the dedicated measurement kit is relatively high. Therefore, performing an electrochemical test at a high current density may not be appropriate. Accordingly, test conditions and types of testable active materials may be limited.

However, according to the present disclosure, the coin-type battery cell 140 may be first formed, for example, in an adjusted environment such as a globe box, the battery cell 140 may be arranged within the battery cell accommodation space 120HA of the battery cell measurement module 100, and a height may be adjusted via the height control part 130. Therefore, the battery cell measurement module 100 may be formed such that the battery cell 140 may be tightly fixed to both the lower housing 110 and the upper housing 170. Therefore, an active material or an electrolyte may be prevented from being damaged in an assembly process of the battery cell 140. Also, the battery cell 140 may be formed to have a relatively low resistance without risk of an electrical short circuit or the like.

Also, the battery cell 140 may be arranged within the battery cell measurement module 100, and the battery cell 140 may be adjusted by the height control part 130 to be tightly fixed to both the upper housing 110 and the lower housing 170. As a result, the battery cell measurement module 100 may have a relatively low resistance. As the resistance of the battery cell measurement module 100 decreases, wanted electrochemical tests (e.g., charging and discharging at a high current rate) may be appropriately performed under various current conditions, or the deviation between an electrochemical behavior within a commercial battery cell and an electrochemical behavior within the battery cell measurement module 100 may be reduced (i.e., the electrochemical behavior in the commercial battery cell may be precisely simulated).

Figure 4:
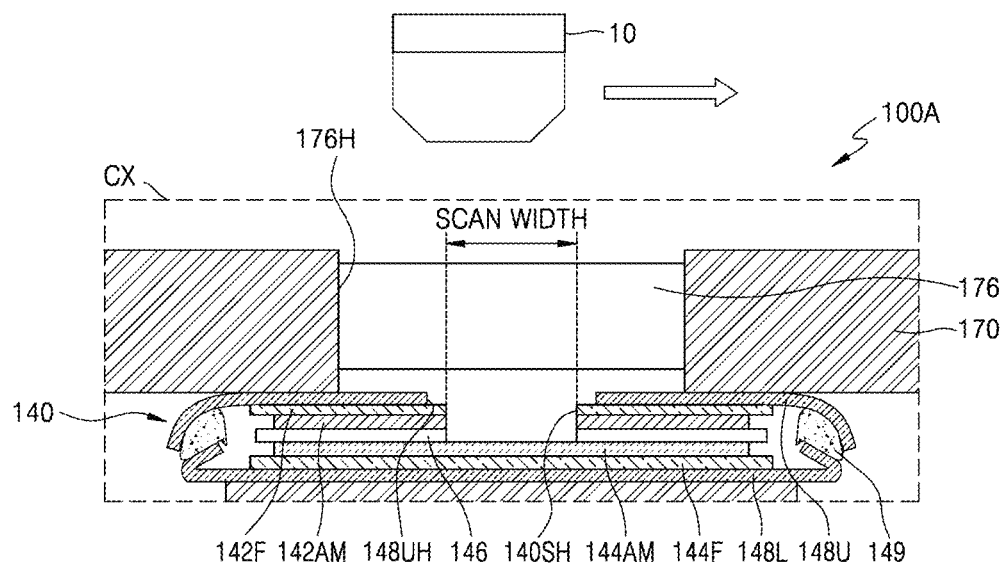
FIG. 4 is a cross-sectional view illustrating a battery cell measurement module according to example embodiments.

FIG. 4 is a cross-sectional view illustrating a battery cell measurement module 100A according to example embodiments. The same reference numerals in FIG. 4 as those in FIGS. 1 through 3 denote the same elements.

Referring to FIG. 4, a battery cell 140 may include a battery stack of a cathode current collector 142F, a cathode active material 142AM, a separator 146, an anode active material 144AM, and an anode current collector 144F. The battery stack may be arranged in a battery stack accommodation space (not shown) of a lower case 148L, and an upper case 148U may cover the lower case 148L.

The battery stack may have a through-hole 140SH in a central region thereof. For example, the through-hole 140SH may pass through the cathode current collector 142F, the cathode active material 142AM, and the separator 146, and the upper surface of the anode active material 144AM may be exposed at the bottom of the through-hole 140SH. The through-hole 140SH may be formed at a position overlapping an opening 148UH of the upper case 148U, and a composition or image of a material may be continuously observed at least one fixed position on the upper surface of the anode active material 144AM exposed at the bottom of the through-hole 140SH via a transparent window 176 and the opening 148UH.

The observation of the upper surface of the cathode active material 142AM has been described with reference to FIG. 3, and the observation of the upper surface of the anode active material 144AM has been described with reference to FIG. 4. In this embodiment, the upper surface of the separator 146, the upper surface of the cathode current collector 142F, or the upper surface of the anode current collector 144F may be observed by adjusting a depth of the through-hole 140SH.

Figure 5:
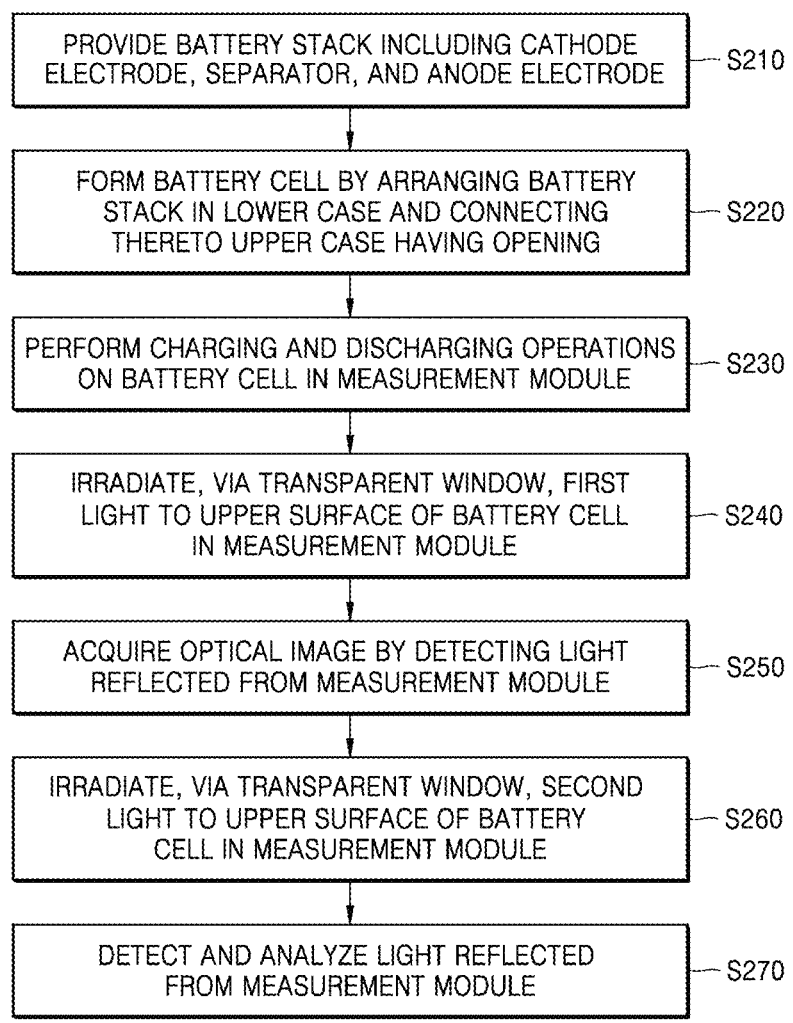
FIG. 5 is a flowchart illustrating an in-situ optical and electrochemical analysis method according to example embodiments.

FIG. 5 is a flowchart illustrating an in-situ optical and electrochemical analysis method according to example embodiments.

Referring to FIG. 5, in operation S210, a battery stack including a cathode electrode, a separator, and an anode electrode are provided.

The battery stack may include a cathode electrode that is formed by coating and drying the cathode active material 142AM on the cathode current collector 142F, an anode electrode that is formed by coating and drying the anode active material 144AM on the anode current collector 144F, and the separator 146 arranged between the cathode electrode and the anode electrode. The battery stack may be soaked in an electrolyte for a certain time.

In a process of forming the battery stack, the through-hole 140SH may be formed by removing a portion of the battery stack. For example, the through-hole 140SH that passes through a central region of the cathode current collector 142F may be formed to observe the surface of the cathode active material 142AM.

In operation S220, a battery cell may be formed by arranging the battery stack within a lower case and connecting thereto an upper case having an opening.

The upper case 148U may have the opening 148UH in the central region thereof and may be arranged so that the opening 148UH and the through-hole 140SH may overlap each other. The battery cell 140 may be arranged so that the surface of the cathode active material 142AM exposed at the bottom of the through-hole 140SH via the opening 148UH may be observed. The upper case 148U and the lower case 148L may be formed to be in contact with the cathode current collector 142F and the anode current collector 144F, respectively, in a pressing method. Accordingly, the resistance inside the battery cell 140 may be relatively low. For example, an operation of forming the battery cell 140 may be performed in an adjusted environment such as a globe box. The adjusted environment may be, for example, a nitrogen atmosphere, and may prevent oxidation of an electrolyte or an active material due to exposure thereof to an atmospheric atmosphere.

In operation S230, charging and discharging operations may be performed on the battery cell within a battery cell measurement module.

Information about a capacity, voltage, current, and time of the battery cell 140 may be obtained via the electrochemical analysis unit 20 connected to the battery cell measurement module 100. For example, a unit charging step or a unit discharging step using a preset current density may be performed on the battery cell 140 via the electrochemical analysis unit 20.

In operation S240, first light may be irradiated, via a transparent window, to the upper surface of the battery cell in the battery cell measurement module.

In operation S250, an optical image may be acquired by detecting light reflected (or light scattered) from the battery cell measurement module.

In operation S260, second light may be irradiated, via the transparent window, to the upper surface of the battery cell in the battery cell measurement module. The second light may be light having a wavelength that is different from that of the first light.

In operation S270, the light reflected (or the light scattered) from the battery cell measurement module may be detected and analyzed.

For example, when a voltage of the battery cell 140 reaches a preset first measurement voltage, operation S240 of irradiating the first light, operation S250 of acquiring the optical image by detecting the scattered light of the first light, operation S260 of irradiating the second light, and operation S270 of detecting and analyzing the scattered light of the second light may be sequentially performed. Operations S240 through S270 may be referred to as "one light measurement cycle." The electrochemical analysis unit 20 may be programmed such that a constant voltage is maintained in the battery cell 140 or the flow of a current is stopped during the light measurement cycle.

For example, operation S260 of irradiating the second light and operation S270 of detecting and analyzing the scattered light of the second light may include acquiring a Raman shift characteristic or a PL characteristic.

In example embodiments, in operation S260 of irradiating the second light, the second light may be continuously irradiated by a first scan width to the upper surface of the battery cell 140 observed via the transparent window 176 (e.g., the upper surface of the cathode active material 142AM or the anode active material 144AM exposed at the bottom of the through-hole 140SH). In other embodiments, in operation S260 of irradiating the second light, the second light may be irradiated sequentially to a plurality of measurement positions on the upper surface of the battery cell 140 observed via the transparent window 176 (e.g., the upper surface of the cathode active material 142AM or the anode active material 144AM exposed at the bottom of the through-hole 140SH).

Operations S210 through S270 may be repeated.

In detail, after one light measurement cycle is performed, a unit charging step or a unit discharging step using a preset current density may be performed again on the battery cell 140 via the electrochemical analysis unit 20. In a second light measurement cycle, the second light may be irradiated to the same measurement position as the measurement position to which the second light is irradiated in a first light measurement cycle. Accordingly, Raman shift information of the cathode active material 142AM or the anode active material 144AM arranged at the same measurement position over time or according to a change in a voltage may be provided. Therefore, phase change characteristics, interfacial characteristics, and/or crystal structure of the cathode active material 142AM or the anode active material 144AM may be precisely analyzed.

For example, sequentially performing operations S210 through S270 may constitute a unit charging step or a unit discharging step. An in-situ optical and electrochemical analysis method according to example embodiments may include a total of five to several tens of unit charging steps and/or a total of five to several tens of unit discharging steps.

In general, in an existing in-situ electrochemical cell, in an assembly process of an in-situ electrochemical cell, an active material and/or an electrolyte is damaged, the in-situ electrochemical cell short-circuits, or the resistance of the electrochemical cell is relatively high. Therefore, precise analysis of an electrochemical behavior of the in-situ electrochemical cell may not be easy.

However, according to the present disclosure, in an adjusted environment such as a globe box, the coin-type battery cell 140 may be first formed, and then the battery cell measurement module 100 may be formed. Therefore, an active material or an electrolyte may be prevented from being damaged in an assembly process of the battery cell 140, and the battery cell 140 may be easily formed to have a relatively low resistance without risk of an electrical short-circuit or the like. As the battery cell measurement module 100 has a low resistance, wanted electrochemical tests (e.g., charging and discharging at a high current rate) may be performed under various current conditions, or the deviation between an electrochemical behavior in a commercial battery cell and an electrochemical behavior in the battery cell measurement module 100 may be reduced (i.e., the electrochemical behavior in the commercial battery cell may be precisely simulated).

Figure 6:
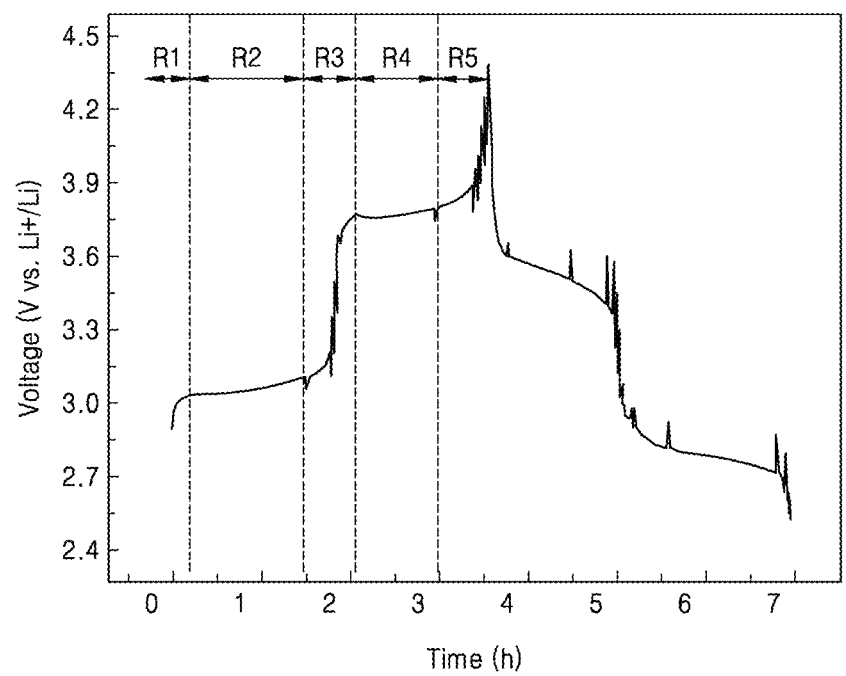
FIG. 6 is a graph illustrating a voltage profile in one-time charging and one-time discharging for a cathode active material.
Figure 7:
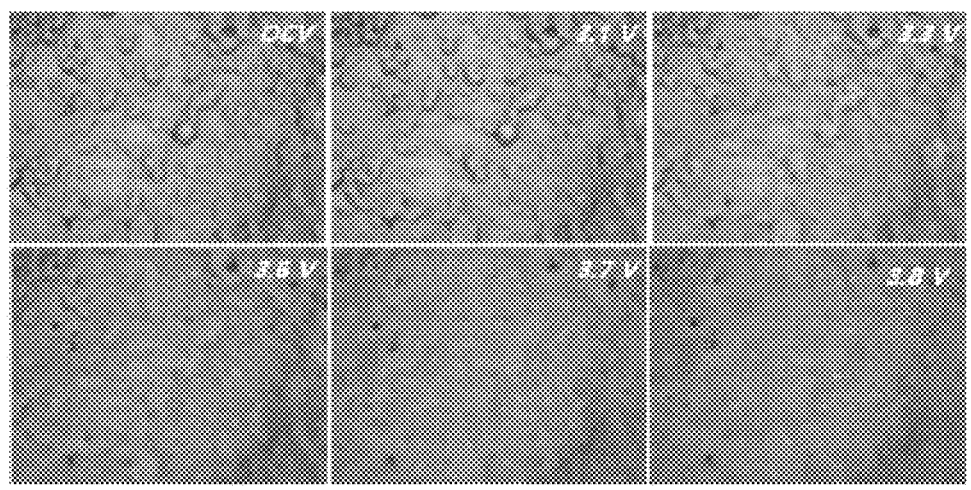
FIG. 7 illustrates optical images of a cathode active material at different voltages during one-time charging.
Figure 8:
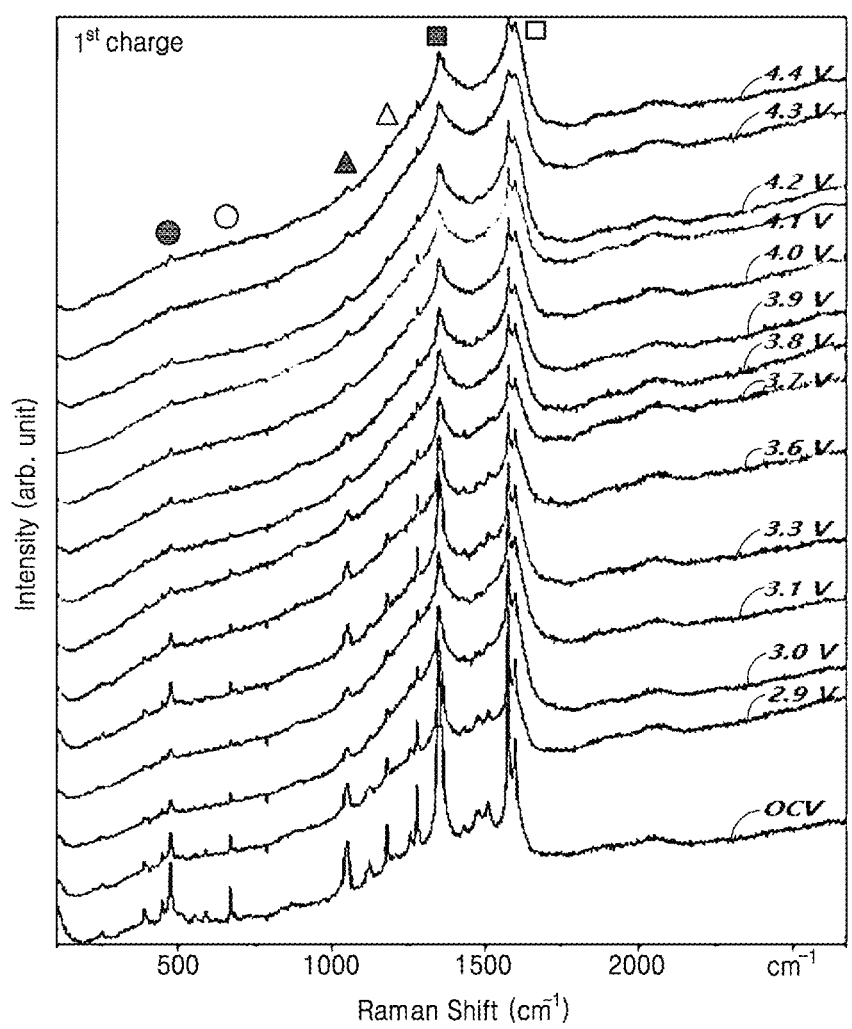
FIG. 8 is Raman shift graphs at different voltages during one-time charging for a cathode active material.

Hereinafter, the result of analysis acquired by performing an in-situ optical and electrochemical analysis method according to example embodiments by using a battery cell measurement module according to example embodiments will be described with reference to FIGS. 6 through 11. FIGS. 6 through 8 illustrates an in-situ optical and electrochemical analysis method performed on a battery cell which uses, as a cathode active material, dimethyl phenazine (DMPZ) that is one of carboorganic cathode materials, and uses lithium metal as an anode active material.

FIG. 6 is a graph illustrating a voltage profile in one-time charging and one-time discharging for a DMPZ cathode active material. FIG. 6 illustrates a voltage of a cathode active material obtained in a constant current mode.

Referring to FIG. 6, the DMPZ, which is a carboorganic cathode material, may show two plateau regions R2 and R4. In detail, after charging starts, a first region R1 where a voltage increases, a second region R2 having a constant voltage section at about 3.0 V to about 3.1 V, a third region R3 where the voltage increases, a fourth region R4 having a constant voltage section at about 3.75 V to about 3.85 V, and a fifth region R5 where the voltage increases are shown.

FIG. 7 illustrates optical images of a cathode active material at different voltages during one-time charging.

FIG. 7 shows optical images of a DMPZ cathode active material obtained from scattering of first light at an open-circuit voltage (OCV), 3.1 V, 3.3 V, 3.6 V, 3.7 V, and 3.8 V.

Referring to FIG. 7, a DMPZ-rich region where DMPZ particles are locally aggregated and arranged is observed at the open-circuit voltage (OCV). After a first plateau section passes, the surface of the DMPZ-rich region changes at 3.3 V (e.g., in a voltage region corresponding to a starting point of the third region in FIG. 6). This change may occur because the DMPZ particles are eluted into an electrolyte as the result of an electrochemical reaction in the first plateau section. The surface of the DMPZ-rich region is further changed at 3.6 V and 3.7 V (i.e., in a voltage region corresponding to an end point of the third region R3 in FIG. 6). At 3.8 V corresponding to a second plateau section (in a voltage region corresponding to the fourth region R4 in FIG. 6), the surface of a measurement region exhibits a smoother morphology, and the amount of DMPZ particles of the DMPZ-rich region is observed smaller. This may occur because the DMPZ is eluted into an electrolyte in a second plateau stage.

FIG. 8 is Raman shift graphs at different voltages during one-time charging for a cathode active material.

Referring to FIG. 8, in a first portion, six peaks including a first peak (denoted with a shaded circle in FIG. 8), a second peak (denoted with a non-shaded circle in FIG. 8), a third peak (denoted with a shaded triangle in FIG. 8), a fourth peak (denoted with a non-shaded triangle in FIG. 8) derived from DMPZ, a fifth peak (denoted with a shaded square in FIG. 8), and a sixth peak (denoted with a non-shaded square in FIG. 8) derived from carbon are observed from an open-circuit voltage (OCV) to 3.1 V in an initial charging stage. The intensity of the first peak, the third peak, and the fourth peak significantly decreases from about 3.6 V, and merely the fifth peak and the sixth peak derived from carbon are observed at about 4.1 V or higher. In other words, DMPZ particles on the surface of a cathode active material are eluted into an electrolyte by passing through a first plateau and a second plateau, and thus, the intensity of the first peak, the second peak, the third peak, and the fourth peak may gradually decrease. These results may also match the results observed in FIG. 7.

Figure 9:
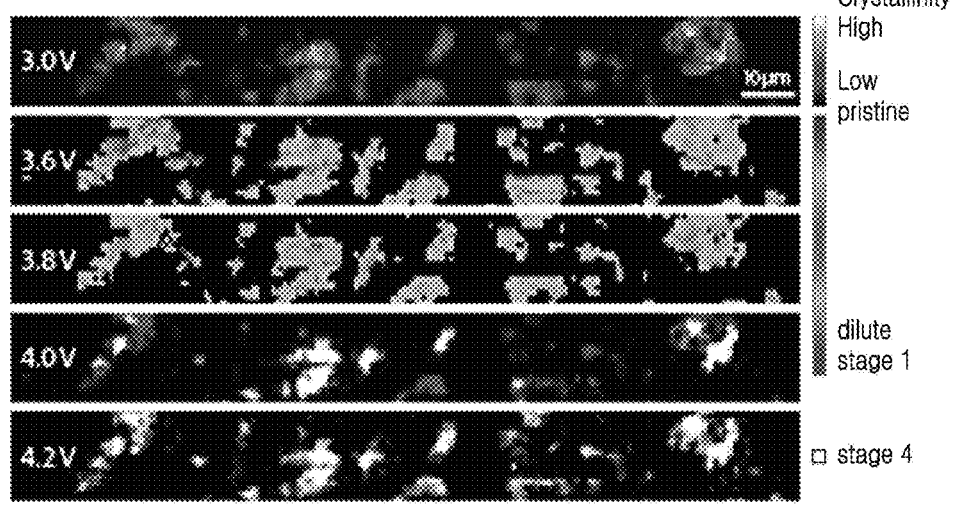
FIG. 9 is a Raman imaging analysis graph at different voltages during one-time charging for an anode active material.
Figure 10:
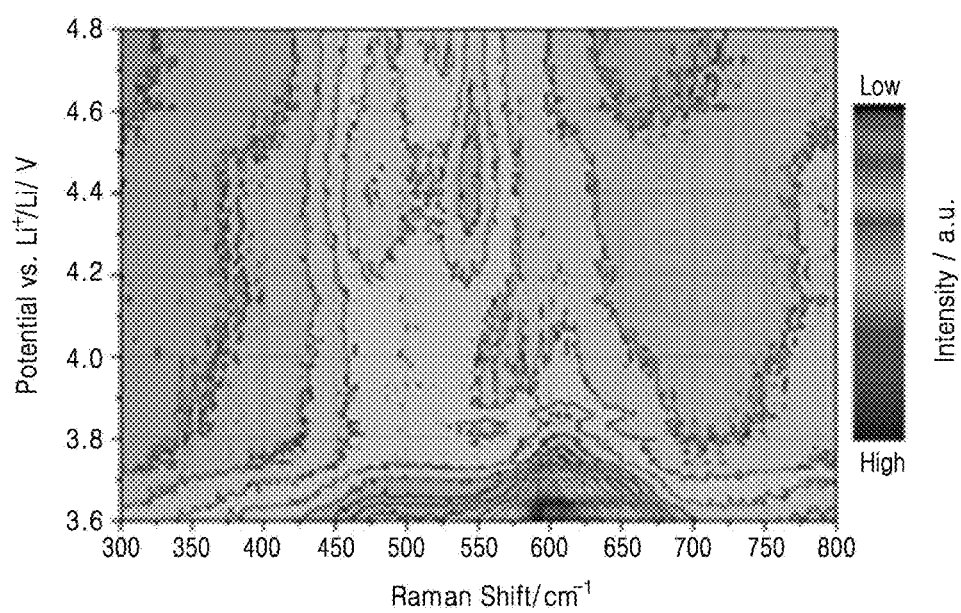
FIG. 10 is a Raman imaging analysis graph at different voltages during one-time charging for a cathode active material.
Figure 11:
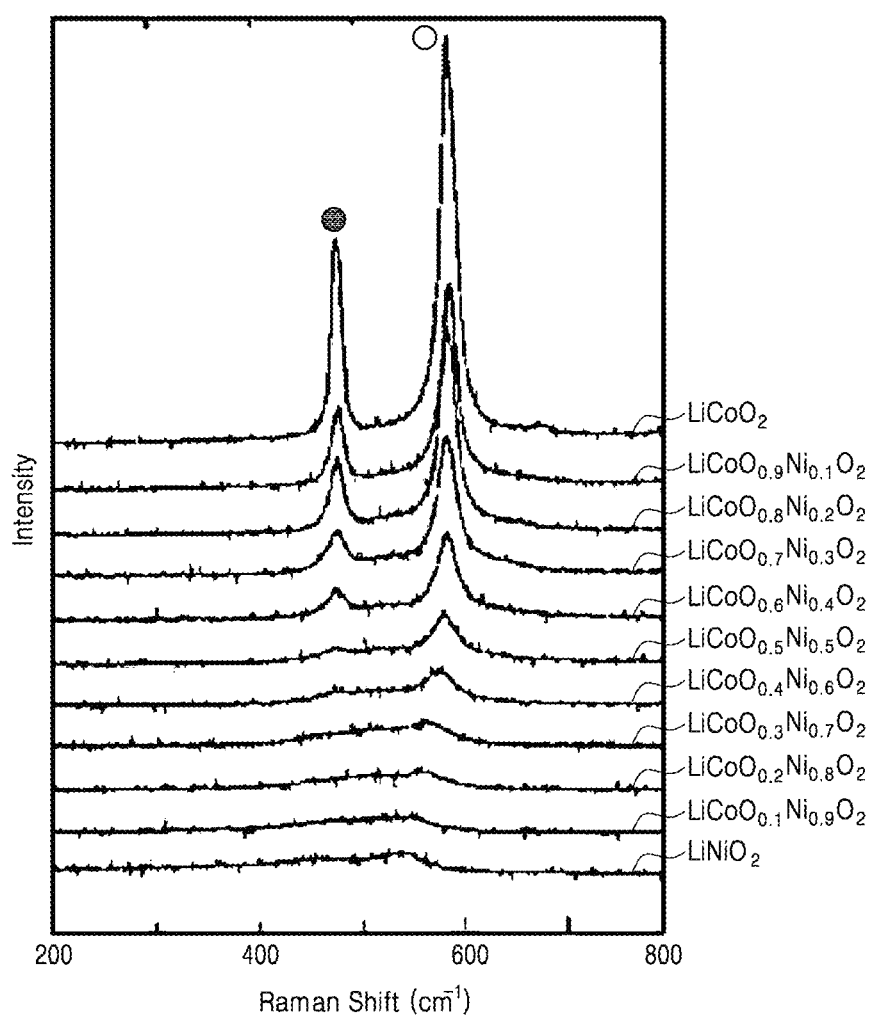
FIG. 11 is a Raman imaging analysis graph according to a change in composition of a cathode active material.

FIGS. 9 to 11 are exemplary results of optical and electrochemical analysis according to Comparative examples. FIG. 9 is a Raman imaging analysis graph at different voltages during one-time charging for an anode active material. FIG. 9 shows the results of performing continuous measurement on a measurement region having a first scan width on the surface of an anode active material using a graphite electrode. FIG. 9 is an analysis image disclosed by Nanophoton Corporation (Japan), which corresponds to the analysis results using a measurement module according to a conventional method in which a cathode, a separator, and an anode are stacked and fixed to each other with a screw.

Referring to FIG. 9, as a cell voltage increases in a graphite electrode portion arranged at the same position, a change in crystallinity may be observed. Also, an anode active material including graphite is uniformly dispersed and arranged in a planar manner in the measurement region having the first scan width.

FIG. 10 is a Raman imaging analysis graph at different voltages during one-time charging for a cathode active material. FIG. 10 shows a contour plot exhibiting the results of in-situ Raman spectroscopy for a battery cell using a cathode active material including lithium nickel cobalt manganese oxide ($LiNi_xCo_yMn_zO_2$). FIG. 10 is an analysis image disclosed in Electrochimica Acta 130, 206-212 (2014) by Patrick Lanz et al., which corresponds to the analysis results using a conventional method in which only Raman shift characteristics are measured on the same measurement spot.

Referring to FIG. 10, a high Raman shift peak is observed at a peak position of about 600 $cm^{-1}$ at an initial charging stage (in a voltage section of 3.6 V). Also, the peak at the peak position of about 600 $cm^{-1}$ gradually decreases, and thus, a particular peak is not observed in a section of about 3.8 V to about 4.2 V. In a section of 4.2 V, new peaks occur at peak positions of about 475 $cm^{-1}$ and about 530 $cm^{-1}$. These peaks show the greatest intensity at about 4.4 V, and the intensity thereof gradually decreases up to 4.8 V.

FIG. 11 is a Raman imaging analysis graph according to a change in composition of a cathode active material. Referring to FIG. 11, Raman shift characteristics are observed by varying the content of cobalt and manganese in a battery cell using lithium cobalt nickel oxide ($LiCo_xNi_{1-x}O_2$, $0 \leq x \leq 1$) as a cathode active material. FIG. 11 is an analysis graph disclosed in Chemistry Letters 889 (1995) by Minoru Inaba et al., which corresponds to the analysis results using a conventional method in which ex-situ Raman shift characteristics are measured for a plurality of analysis samples having different compositions.

Referring to FIG. 11, as the content of cobalt in a cathode active material increases (i.e., at x>0.5, e.g., as the content of nickel decreases), a first peak (denoted with a shaded circle in FIG. 11) and a second peak (denoted with a non-shaded circle in FIG. 11) are observed. An anode active material having a composition range of lithium cobalt manganese oxide ($LiCo_xNi_{1-x}O_2$, $0.5 \leq x \leq 1$) has substantially the same crystal structure as lithium cobalt oxide. Also, as the content of cobalt increases, crystallinity gradually increases.

As described above in detail with reference to FIGS. 6 through 11, via a battery cell measurement module and an in-situ optical and electrochemical analysis method according to the present disclosure, electrochemical behaviors and crystal structures of various types of cathode active materials and anode active materials may be clearly observed. Therefore, various approaches for performance improvement and commercialization of various types of cathode active materials and anode active materials may be derived. The present disclosure is not limited to test conditions and types of materials, and may be applied to comprehensive analysis of electrochemical behaviors such as identification of electrochemical reactions of various types of cathode active materials and anode active materials, observation of a change in crystalline phase or crystal structure, analysis of a reaction rate in a local region, observation of interfacial movement of an active material, and observation of a change in local thickness of an active material.

While the present disclosure has been particularly shown and described with reference to example embodiments thereof, it will be understood by those skilled in the art that various changes in form and details may be made therein without departing from the spirit and scope of the disclosure as defined by the appended claims.

Acknowledgement

This research was supported by the Basic Science Research Program through the National Research Foundation of Korea funded by the Ministry of Science and ICT (NRF-2017M3A7B4049176).

This work was supported by the Korea Basic Science Institute (KBSI) grant No. T38606.

This work was supported by the National Research Foundation of Korea (NRF) grant funded by Korea government (MSIT)(2018R1A5A 1025224).

This research was supported by Creative Materials Discovery Program through the National Research Foundation of Korea (NRF) funded by the Ministry of Science, ICT and Future Planning (NRF-2017M3D1A1039561).

The invention claimed is:

1. A battery cell measurement module comprising:
a lower housing having a connection part formed on an upper portion of the lower housing;
a fixing part connected to the lower housing, an upper portion of the fixing part having a battery cell accommodation space in which a battery cell is accommodated, the fixing part including a connection hole in communication with the battery cell accommodation space, the connection hole having the connection part arranged therein;
a height control part that extends from the battery cell accommodation space of the fixing part to the connection part via the connection hole;
an upper housing that is detachably attached to the lower housing, the upper housing arranged to surround the fixing part and the height control part, the upper housing provided with a transparent window; and
wherein the connection part further comprises:
a lower connection part connected to the lower housing; and
an upper connection part connected to the upper housing,
wherein the battery cell comprises:
an opening in an upper surface of the battery cell such that the opening is located at a position vertically overlapping with the transparent window,
a lower case including a battery stack accommodation space;
a cathode current collector which is arranged in the battery stack accommodation space and has a cathode active material attached thereto;
an anode current collector which is arranged in the battery stack accommodation space and has an anode active material attached thereto;
a separator arranged between the cathode active material and the anode active material; and
an upper case which covers the battery stack accommodation space and has the opening, and
wherein the lower case of the battery cell is electrically connected to the lower connection part via the height control part, the connection part, and the lower housing, and
the upper case of the battery cell is electrically connected to the upper connection part via the upper housing.

2. The battery cell measurement module of claim 1, wherein
the height control part comprises: an upper plate body having the battery cell arranged on an upper portion of the upper plate body; and
a fixing pillar portion formed at a lower portion of the upper plate body and formed to be connected to the connection part, wherein a height of the height control part is adjusted via the fixing pillar portion.

3. The battery cell measurement module of claim 1, wherein
the cathode current collector comprises a through-hole at a position overlapping the opening, and
the cathode current collector is arranged such that an upper surface of the cathode active material is exposed via the through-hole and the opening to be observed via the transparent window.

4. The battery cell measurement module of claim 1, wherein
the cathode current collector, the cathode active material, and the separator comprise a through-hole at a position overlapping the opening, and
the cathode current collector, the cathode active material, and the separator are arranged such that an upper surface of the anode active material is exposed via the through-hole and the opening to be observed via the transparent window.

5. The battery cell measurement module of claim 1, further comprising:
a spacer arranged between the height control part and the battery cell.

6. An in-situ optical and electrochemical analysis method using a battery cell measurement module, the battery cell measurement module comprising
a lower housing having a connection part formed on an upper portion of the lower housing;
a fixing part connected to the lower housing, an upper portion of the fixing part having a battery cell accommodation space in which a battery cell is accommodated, the fixing part including a connection hole in communication with the battery cell accommodation space, the connection hole having the connection part arranged therein;
a height control part that extends from the battery cell accommodation space of the fixing part to the connection part via the connection hole;
an upper housing that is detachably attached to the lower housing, the upper housing arranged to surround the fixing part and the height control part, the upper housing provided with a transparent window; and
the battery cell that has an opening in an upper surface of the battery cell, the battery cell is accommodated in the battery cell accommodation space such that the opening is located at a position vertically overlapping the transparent window,
wherein the in-situ optical and electrochemical analysis method comprises:
performing charging and discharging operations on the battery cell measurement module; and
performing, a plurality of times, a light measurement cycle on the battery cell measurement module, wherein the light measurement cycle comprises:
irradiating first light to a first portion of the battery cell observed via the transparent window;
detecting the first light scattered from the battery cell;
irradiating, to the first portion of the battery cell observed via the transparent window, second light having a second wavelength that is different than a first wavelength of the first light; and
detecting the second light scattered from the battery cell.

7. The in-situ optical and electrochemical analysis method of claim 6, wherein the irradiating of the second light comprises continuously irradiating the second light by a first scan width along the upper surface of the battery cell observed via the transparent window.

* * * * *